United States Patent
Joo (10) Patent No.: US 9,349,483 B2
(45) Date of Patent: May 24, 2016

(54) ONE-TIME PROGRAMMABLE MEMORY AND SYSTEM-ON CHIP INCLUDING ONE-TIME PROGRAMMABLE MEMORY

(71) Applicant: Samsung Electronics Co., Ltd., Suwon-Si, Gyeonggi-Do (KR)

(72) Inventor: Jong-Doo Joo, Seoul (KR)

(73) Assignee: SAMSUNG ELECTRONICS CO., LTD., Gyeonggi-Do (KR)

(*) Notice: Subject to any disclaimer, the term of this patent is extended or adjusted under 35 U.S.C. 154(b) by 0 days.

(21) Appl. No.: 14/539,605

(22) Filed: Nov. 12, 2014

(65) Prior Publication Data

US 2015/0138870 A1    May 21, 2015

(30) Foreign Application Priority Data

Nov. 18, 2013    (KR) .................. 10-2013-0140088

(51) Int. Cl.
  *G11C 17/16*    (2006.01)
  *G11C 17/18*    (2006.01)
  *G11C 7/04*     (2006.01)

(52) U.S. Cl.
  CPC  *G11C 17/18* (2013.01); *G11C 7/04* (2013.01); *G11C 17/165* (2013.01)

(58) Field of Classification Search
  CPC .............................. G11C 17/165; G11C 17/16
  USPC .................................................... 365/104, 96
  See application file for complete search history.

(56) References Cited

U.S. PATENT DOCUMENTS

| | | | |
|---|---|---|---|
| 7,626,448 B2 | 12/2009 | Byeon et al. | |
| 7,696,977 B2 | 4/2010 | Lee et al. | |
| 7,737,768 B2 | 6/2010 | Byeon | |
| 8,040,176 B2 | 10/2011 | Ito | |
| 8,049,552 B2 | 11/2011 | Byeon | |
| 8,466,666 B2 | 6/2013 | Wang et al. | |
| 2003/0198085 A1* | 10/2003 | Peng | 365/185.12 |
| 2004/0031853 A1* | 2/2004 | Peng | 235/492 |
| 2007/0183181 A1* | 8/2007 | Peng et al. | 365/96 |
| 2008/0013376 A1* | 1/2008 | Sim | 365/185.13 |
| 2008/0042736 A1 | 2/2008 | Byeon | |
| 2009/0040163 A1 | 2/2009 | Sun | |
| 2010/0177550 A1* | 7/2010 | Hase et al. | 365/100 |
| 2010/0264899 A1 | 10/2010 | Ito et al. | |
| 2012/0133803 A1 | 5/2012 | Lee et al. | |

FOREIGN PATENT DOCUMENTS

| | | |
|---|---|---|
| JP | 2006065945 A | 3/2006 |
| JP | 2010165071 A | 7/2010 |
| KR | 100518565 B1 | 10/2005 |

* cited by examiner

*Primary Examiner* — Hoai V Ho
*Assistant Examiner* — Jay Radke
(74) *Attorney, Agent, or Firm* — Harness, Dickey & Pierce, P.L.C.

(57) ABSTRACT

A one-time programmable (OTP) memory includes an OTP cell array including a plurality of OTP cells that each include a programming transistor configured to change irreversibly when programmed; a temperature compensation reference voltage generating unit configured to sense a temperature of the OTP cell memory and generate a reference voltage such that as the sensed temperature changes, the reference voltage generated by the temperature compensation reference voltage generating unit changes in a manner that is inversely proportional the change in the sensed temperature; and a temperature compensation operating voltage generating unit configured to receive the reference voltage to generate an operating voltage that is proportional to the reference voltage and is applied to the OTP cell array.

20 Claims, 10 Drawing Sheets

FIG. 14

ONE-TIME PROGRAMMABLE MEMORY AND SYSTEM-ON CHIP INCLUDING ONE-TIME PROGRAMMABLE MEMORY

CROSS-REFERENCE TO RELATED APPLICATIONS

This application claims priority under 35 U.S.C. §119 to Korean Patent Application No. 10-2013-0140088, filed on Nov. 18, 2013, in the Korean Intellectual Property Office, the disclosure of which is incorporated herein in its entirety by reference.

BACKGROUND

Example embodiments of the inventive concepts relate to a one-time programmable (OTP) memory and a system-on chip (SoC) including the OTP memory, and more particularly, to an OTP memory having a high reliability and a system-on chip including the OTP memory.

An OTP memory is a non-volatile memory capable of permanently storing programmed data even if power is not supplied. As an OTP memory is advantageous in terms of manufacture and security, the OTP memory is used as a substitute for an eFuse in an SoC or the like.

SUMMARY

Example embodiments of the inventive concepts provide a one-time programmable (OTP) memory having a high reliability and a system-on chip (SoC) including the OTP memory.

According to at least one example embodiment of the inventive concepts, there is provided an one-time programmable (OTP) memory including: an OTP cell array including a plurality of OTP cells that each include a programming transistor which changes irreversibly when programmed; a temperature compensation reference voltage such that as the sensed temperature changes, the reference voltage generated by the temperature compensation reference voltage generating unit changes in a manner that is inversely proportional to the change in the sensed temperature; and a temperature compensation operating voltage generating unit that receives the reference voltage to generate an operating voltage that is proportional to the reference voltage and is applied to the OTP cell array.

The temperature compensation operating voltage generating unit may include: a charge pumping unit that performs charge pumping the reference voltage to generate the operating voltage as a programming voltage corresponding to a programming command applied to the OTP memory; and a voltage regulator that performs voltage regulation of the reference voltage to generate the operating voltage as a reading voltage corresponding to a reading command applied to the OTP memory.

The programming voltage may be applied to a gate of the programming transistor and is inversely proportional to a temperature of the OTP memory.

Each OTP cell may further include a reading transistor that has a gate through which the reading voltage is applied, wherein the reading voltage is inversely proportional to the temperature of the OTP memory.

The charge pumping unit may include: a first level up regulator that regulates the reference voltage to a first voltage having a higher voltage level than the reference voltage; a voltage detector that detects a difference between the first voltage and a second voltage having a voltage level corresponding to a feedback voltage of the programming voltage, to output a detection voltage; and a charge pump that outputs a voltage corresponding to the detection voltage as the programming voltage.

The charge pumping unit may further include a voltage distributor that distributes the feedback voltage to output the voltage-distributed feedback voltage as the second voltage.

The voltage regulator may include: a second level up regulator that regulates the reference voltage to a third voltage having a higher voltage level than the reference voltage; and a temperature compensator that senses a temperature of the OTP memory to generate the third voltage as the reading voltage that is inversely proportional to the sensed temperature.

In response to a programming command applied to the OTP memory, all OTP cells of the OTP cell array may be simultaneously programmed.

In response to a programming command applied to the OTP memory, some of the OTP cells of the OTP cell array may be simultaneously programmed.

The programming transistor of each of the plurality of OTP cells may have a gate that is connected to a corresponding programming word line from among word lines of the OTP cell array; and wherein each of the plurality of OTP cells may further include: a reading transistor having a first terminal that is connected to a first terminal of the programming transistor and a second terminal that is connected to a corresponding bit line from among bit lines of the OTP cell array, and a gate that is connected to a corresponding reading word line from among the word lines of the OTP cell array.

The programming transistors of each of the plurality of OTP cells may be a metal oxide semiconductor field effect transistor (MOSFET).

The temperature compensation operating voltage generating unit may include a bandgap voltage reference circuit.

The OTP memory may further include: a row decoder that activates at least one word line corresponding to a row address from among word lines of the OTP cell array; a column decoder that activates at least one bit line corresponding to a column address from among bit lines of the OTP cell array; and an address processor that extracts the row address and the column address from an external address input to the OTP memory from a source the outside the OTP memory to respectively transmit the row address and the column address to the row decoder and the column decoder.

The OTP memory may further include: a sensing amplify that senses and amplifies an electrical signal of the activated at least one bit line in response to a reading command applied to the OTP memory; a data input/output unit that outputs the electrical signal that is sensed and amplified by the sensing amplifier, as data corresponding to the reading command; and a current controller that sinks a current flowing through the activated at least one bit line to ground, in response to a programming command applied to the OTP memory.

According to at least one example embodiment of the inventive concepts, there is provided a system-on chip (SoC) including a one-time programmable (OTP) memory, wherein the OTP memory includes: an OTP cell array including a plurality of OTP cells that each include a programming transistor which changes irreversibly when programmed; a temperature compensation reference voltage generating unit that senses a temperature of the OTP cell memory and generates a reference voltage such that as the sensed temperature changes, the reference voltage generated by the temperature compensation reference voltage generating unit changes in a manner that is inversely proportional the change in the sensed temperature; and a temperature compensation operating voltage generating unit that receives the reference voltage to generate an operating voltage that is proportional to the reference voltage and is applied to the OTP cell array.

According to at least one example embodiment of the inventive concepts, a memory apparatus may include a memory cell array including a plurality of one time programmable (OTP) memory cells, the plurality of OTP memory cells each including a respective one of a plurality of programming transistors; an operating voltage generation unit configured to generate an operating voltage based on a reference voltage and configured to apply the operating voltage to the memory cell array; and a reference voltage generation unit configured generate the reference voltage based on a temperature of the memory apparatus such that as the sensed temperature changes, the reference voltage generated by the temperature compensation reference voltage generating unit changes in a manner that is inversely proportional the change in the sensed temperature, the memory apparatus being configured such that programming a selected cell from among the plurality OTP memory cells includes changing, in an irreversible manner, a program state of the respective programming transistor included in the selected cell.

The operating voltage generation unit may be configured to generate the operating voltage such that the generated operating voltage is one of a reading voltage for reading data stored in the memory cell array and a programming voltage for programming data into the memory cell array.

The operating voltage generating unit may include a charge pumping unit configured to perform a charge pumping operation on the reference voltage to generate the operating voltage as the programming voltage.

The operating voltage generating may include a voltage regulator configured to perform a voltage regulation operation on the reference voltage to generate the operating voltage as the reading voltage.

The programming transistor of each of the plurality of OTP cells may have a gate that is connected to a corresponding programming word line from among word lines of the memory cell array; and each of the plurality of OTP cells may further include a reading transistor having a first terminal that is connected to a first terminal of the programming transistor, a second terminal that is connected to a corresponding bit line from among bit lines of the memory cell array, and a gate that is connected to a corresponding reading word line from among the word lines of the memory cell array.

BRIEF DESCRIPTION OF THE DRAWINGS

The above and other features and advantages of example embodiments of the inventive concepts will become more apparent by describing in detail example embodiments of the inventive concepts with reference to the attached drawings. The accompanying drawings are intended to depict example embodiments of the inventive concepts and should not be interpreted to limit the intended scope of the claims. The accompanying drawings are not to be considered as drawn to scale unless explicitly noted.

DETAILED DESCRIPTION OF THE EMBODIMENTS

Detailed example embodiments of the inventive concepts are disclosed herein. However, specific structural and functional details disclosed herein are merely representative for purposes of describing example embodiments of the inventive concepts. Example embodiments of the inventive concepts may, however, be embodied in many alternate forms and should not be construed as limited to only the embodiments set forth herein.

Accordingly, while example embodiments of the inventive concepts are capable of various modifications and alternative forms, embodiments thereof are shown by way of example in the drawings and will herein be described in detail. It should be understood, however, that there is no intent to limit example embodiments of the inventive concepts to the particular forms disclosed, but to the contrary, example embodiments of the inventive concepts are to cover all modifications, equivalents, and alternatives falling within the scope of example embodiments of the inventive concepts. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments of the inventive concepts. As used herein, the term "and/or" includes any and all combinations of one or more of the associated listed items.

It will be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments of the inventive concepts. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Figure 1A:
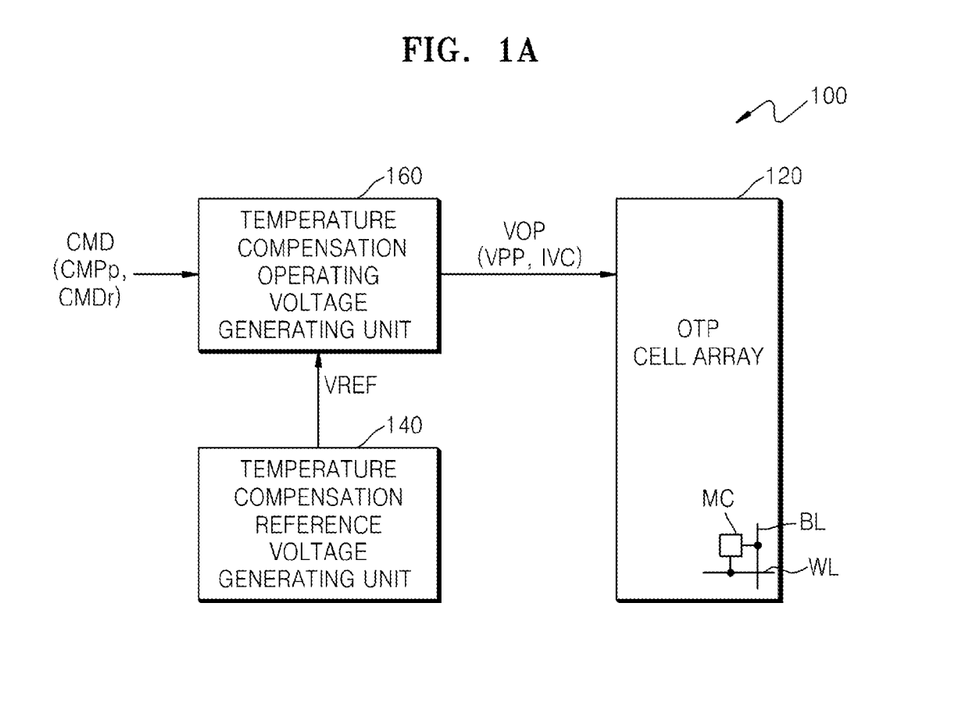
FIG. 1A is a block diagram of a one-time programmable (OTP) memory according to at least one example embodiment of the inventive concepts.
Figure 1B:
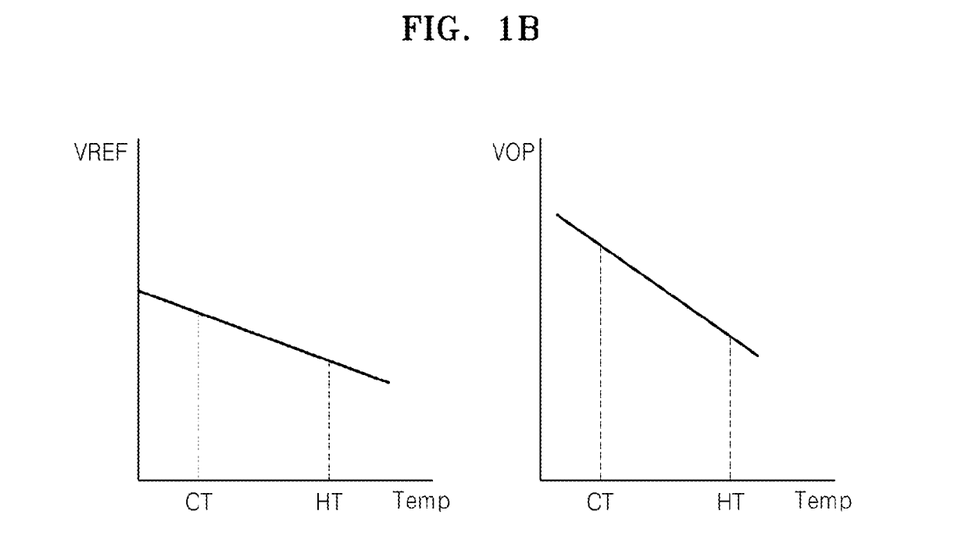
FIG. 1B is a graph showing characteristics between a reference voltage and an operating voltage of the OTP memory according to at least one example embodiment of the inventive concepts.

FIG. 1A is a block diagram of a one-time programmable (OTP) memory 100 according to at least one example embodiment of the inventive concepts, and FIG. 1B is a graph showing characteristics between a reference voltage and an operating voltage of the OTP memory 100 according to at least one example embodiment of the inventive concepts. Referring to FIG. 1A, the OTP memory 100 is a type of non-volatile memory. A non-volatile memory is a type of data storage device that maintains data in storage even when power supply is cut off. Examples of the non-volatile memory include read only memory (ROM), a magnetic disk, an optical disk, and a flash memory. In particular, a type of non-volatile memory that is not capable of modifying data once the data is written is referred to as an OTP memory. When data is programmed to an OTP memory, a structure of an OTP cell, which is a unit of data storage, included in the OTP memory is irreversibly changed, and 0 or 1 may be stored by using these characteristics.

The OTP memory 100 may be used, for example, in storing set up data for controlling an operation of a semiconductor device or a system-on chip (SoC) in which the OTP memory 100 is included. For example, the OTP memory 100 may be used in storing set up data (codes) used in performing a trimming function in a display driver IC (DDI). Alternatively, the OTP memory 100 may be used in repairing a semiconductor device in which the OTP memory 100 is included. For example, a semiconductor device may be tested, characteristics of the semiconductor device according to a test result may be stored in the OTP memory 100 in the semiconductor device, and the semiconductor device may operate based on information stored in the OTP memory 100 to thereby prevent a malfunction of the semiconductor device.

The OTP memory 100 includes an OTP cell array 120, a temperature compensation reference voltage generating unit 140, and a temperature compensation operation voltage generating unit 160. The OTP cell array 120 includes a plurality of OTP cells MC that are each connected to a word line WL and a bit line BL. When a word line WL and a bit line BL are respectively activated according to a row address and a column address, an OTP cell connected to the activated word line WL and the activated bit line BL may be selected. Data may be programmed on the selected OTP cell MC, or data may be read from the selected OTP cell MC.

An OTP cell MC includes a program transistor whose electrical characteristics are irreversibly changed as the OTP cell MC is programmed. In the present specification, programming may be understood as an operation of storing data 0 or data 1 in an OTP cell MC. In the examples discussed herein, an OTP cell MC has data 0 stored as a default state, and when programming is performed, a programming voltage VPP is applied to OTP cells MC, to which data 1 is to be programmed, to thereby irreversibly change electrical characteristics of a program transistor. For example, when data of 1 and 0 is to be programmed on first and second OTP cells, which are adjacent to each other, respectively, a programming operation may be performed by applying a programming voltage VPP only to the first OTP cell, and maintaining the second OTP cell in a default state.

However, example embodiments of the inventive concepts are not limited thereto. In the present specification, programming may be understood as storing data in an OTP cell. In this case, a programming command CMDp may be applied only to OTP cells MC that are to store data 1. For example, an external address that is applied together with a programming command CMDp or that is applied by being included in a programming command CMDp may represent only an OTP cell MC that is to store data 1. A structure of a programming transistor included in an OTP cell MC and a structure of an OTP cell MC will be described in detail later.

According to at least one example embodiment of the inventive concepts, the temperature compensation reference voltage generating unit 140 may sense a temperature of the OTP memory 100 and generate a reference voltage VREF that is inversely proportional to the sensed temperature as illustrated in FIG. 1B. Referring to FIG. 1B, a reference voltage VREF that is at a higher voltage level at a relatively low temperature (for example, a low temperature CT) than at a relatively high temperature (for example, a high temperature HT) is generated. A voltage level of the reference voltage VREF at a low temperature CT and a high temperature HT may be set as an experimental value for which characteristics of the OTP memory 100 are considered. As used herein, low temperature CT and the high temperature HT do not refer to specific temperatures but refer to relative low and high temperatures. The same also applies below.

According to the example illustrated in FIG. 1(a), the temperature compensation operating voltage generating unit 160 receives the reference voltage VREF to generate an operating voltage VOP that is proportional to the reference voltage VREF, as illustrated in FIG. 1B. Because the reference voltage VREF is inversely proportional to a temperature, the generated operating voltage VOP is also at a higher voltage level at a relatively low temperature (for example, a low temperature CT) than at a relatively high temperature (for example, a high temperature HT). Voltage levels of the operating voltage VOP at a low temperature CT and a high temperature HT may be set experimental values for which characteristics of the OTP memory 100 are considered.

The operating voltage VOP is applied to the OTP cell array 120. The operating voltage VOP may be a programming voltage VPP corresponding to a programming command CMDp or a reading voltage IVC corresponding to a reading command CMDr. Details of the operating voltage VOP will be described in connection with the structure of the OTP Cell MC below.

Figure 2:
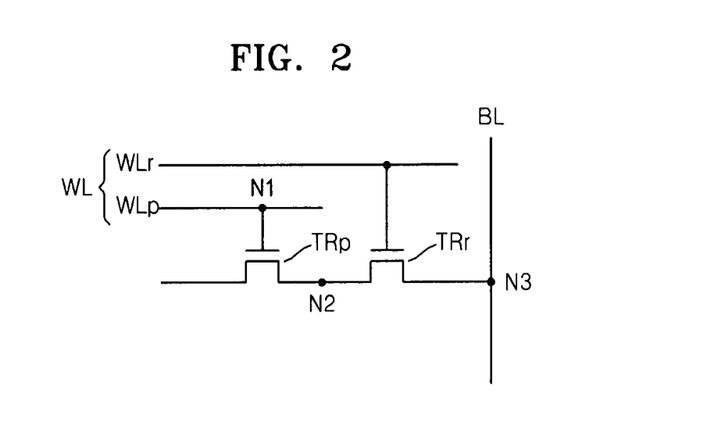
FIGS. 2 through 4 illustrate a structure of an OTP cell of FIG. 1A and programming and reading operations in the OTP cell.

FIG. 2 illustrates a structure of the OTP cell MC of FIG. 1A.

Referring to FIGS. 1A and 2, the OTP cell MC may include a programming transistor TRp and a reading transistor TRr. In the example illustrated in FIG. 2, a gate of the programming transistor TRp is connected to a programming word line WLp. A first terminal of the reading transistor TRr is connected to a first terminal of the programming transistor TRp, a second terminal of the programming transistor TRp is connected to a bit line BL, and a gate of the reading transistor TRr is connected to a reading word line WLr of the word line WL.

The programming transistor TRp and the reading transistor TRr may be, for example, metal oxide semiconductor field effect transistors (MOSFETs). According to at least one example embodiments, the OTP memory 100 may include OTP cells MC formed of only MOSFETs and thus may be manufactured by using a complementary metal oxide semiconductor (CMOS) process that does not use a mask operation or an additional layer, thereby reducing manufacturing costs. Also, since the OTP memory 100 may be operated such that no visible physical change in the structure of OTP cells is caused in the OTP memory 100 during programming, security of the OTP memory 100 may be maintained. Accordingly, the OTP memory 100 may easily replace eFuse in a SoC or the like.

According to at least one example embodiment, a programming voltage VPP may be applied to an activated programming word line WL. The programming word line WL may be activated according to a row address XAdd extracted from an external address EAdd that is included in a programming command CMPp or input to the OTP memory 100 together with the programming command CMPp, which corresponds to the programming command CMDp. For example, all OTP cells MC of the OTP cell array 120 may be simultaneously programmed in response to the programming command CMDp. Alternatively, some of the OTP cells MC of the OTP cell array 120 may be simultaneously programmed in response to a programming command CMDp. For example, half or an eighth of the OTP cells MC of the OTP cell array 120 may be simultaneously programmed.

A programming voltage VPP may be applied to the gate of the programming transistor TRp via the programming word line WL. As described above, according to at least one example embodiment of the inventive concepts the programming transistor TRp of the OTP cells MC is irreversibly changed according to programming. In an OTP cell MC, for example, a programming operation (a programming operation with respect to data 1) may be performed by breaking down a gate oxide layer of the programming transistor TRp. However, the programming operation is not limited thereto. A programming operation with respect to data 1 may also be performed by breaking down a junction of the programming transistor TRp. However, for convenience of description, the description herein will focus on a programming operation performed by breaking down a gate oxide layer.

Before a gate oxide layer is broken down, two terminals of the programming transistor, that is, a node N1 and a node N2, may be separated via the gate oxide layer, and thus resistance is relatively great. Thus, the node N1 and the node N2 are in a non-conducting state. On the other hand, as the gate oxide layer is broken down, the two terminals of the programming transistor TRp, that is, the node N1 and the node N2, may be irreversibly changed from a non-conducting state to a conducting state. According to at least one example embodiment of the inventive concepts, when the gate oxide layer is broken down, resistance between the node N1 and the node N2 decreases.

Figure 3:
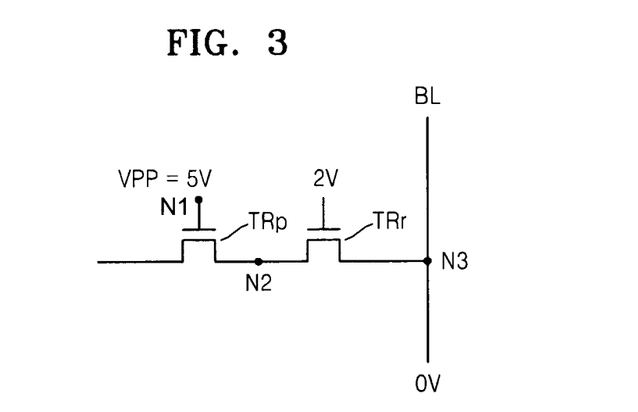

A voltage that is considerably higher than a threshold voltage of the programming transistor TRp and sufficient for a gate oxide layer to break down may be applied as the programming voltage VPP. For example, as illustrated in FIG. 3, if a threshold voltage of the programming transistor TRp is about 1 V, a programming voltage VPP of about 5 V may be applied. As described above, the programming voltage VPP may be applied to the gate of the programming transistor TRp via the programming word line WL. In this case, a voltage of about 2 V may be applied to the gate of the reading transistor TRr, and a voltage of about 0 V may be applied to the bit line BL. A threshold voltage of the reading transistor TRr may be equal to the threshold voltage of the programming transistor TRp.

Figure 4:
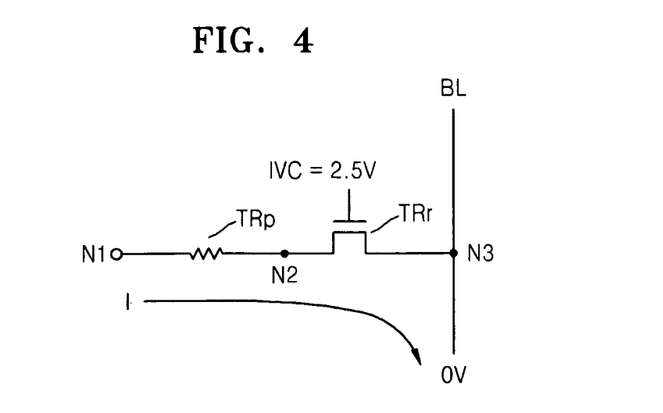

In a programming transistor TRp of an OTP cell MC that is programmed as described with reference to FIG. 3, a gate oxide layer thereof may be broken down, and the gate oxide layer may be equivalently converted into a low resistance state. As a reading voltage IVC of about 2.5 V is applied to the gate of the reading transistor TRr of the OTP cell MC that is programmed as described with reference to FIG. 3 and a voltage of about 0 V is applied to the bit line BL, a current corresponding to the voltage and resistance of the node N1 may flow through the bit line BL, thereby performing a reading operation.

As described above, a relatively high voltage that is sufficient to break down a gate oxide layer is applied to the programming transistor TRp of the OTP memory 100, and due to device characteristics of a MOSFET, if a high voltage as described above is applied, a yield or reliability of the OTP memory 100 may vary according to a temperature. For example, a higher programming voltage VPP that is needed for all OTP cells MC, which require programming, in order to accurately program the OTP cells MC may be required at a low temperature CT than at a high temperature HT. That is, a programming success rate may be lower at a low temperature CT than at a high temperature HT.

Figure 5A:
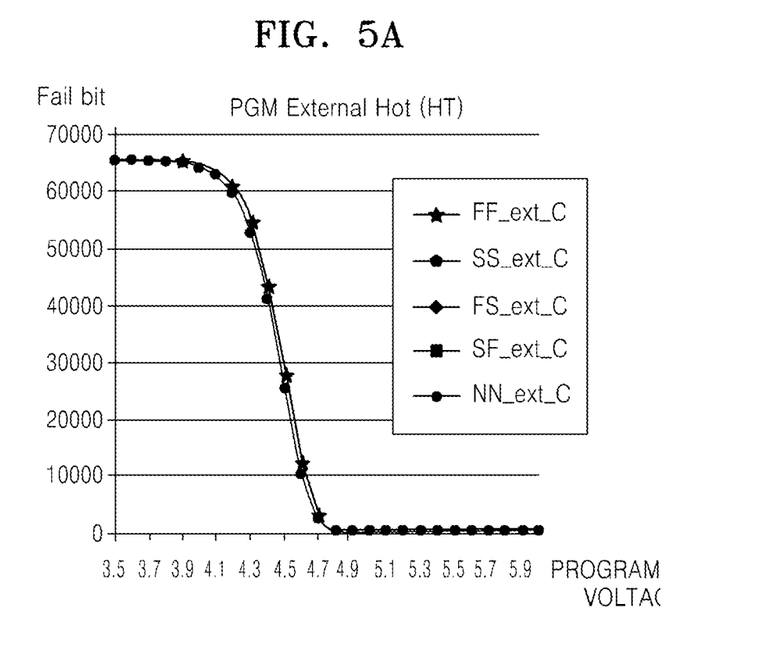
FIGS. 5A, 5B, 5C, and 6 are graphs showing characteristics of an OTP memory according to at least one example embodiment of the inventive concepts.
Figure 5B:
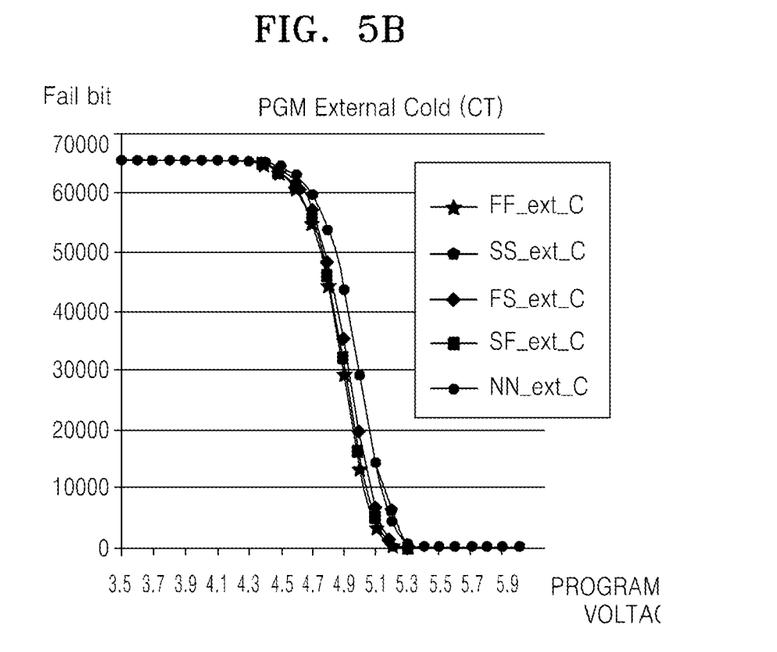
Figure 5C:
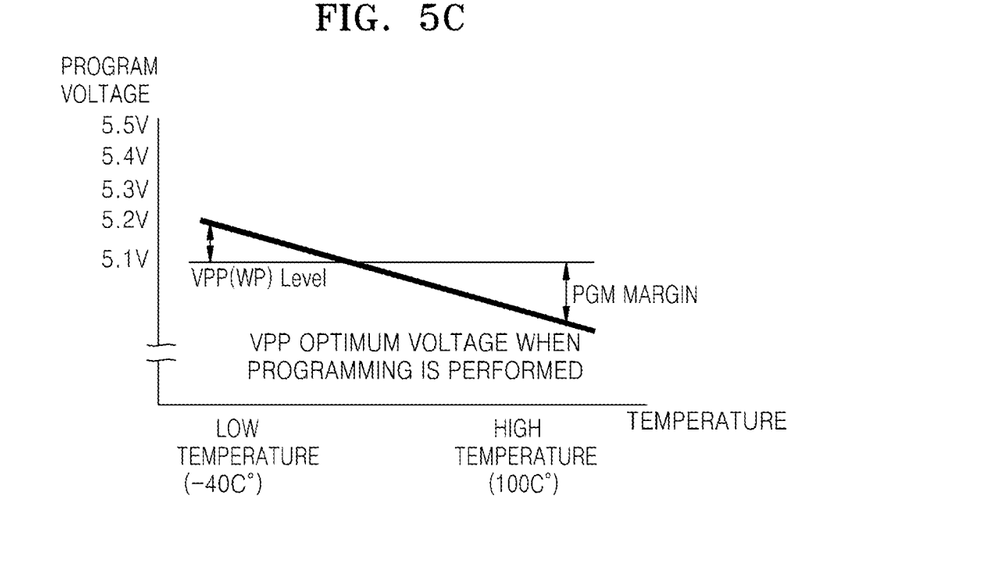

For example, as illustrated in FIGS. 5A and 5B illustrating yield characteristics according to a voltage level of a programming voltage that is uniformly applied to OTP cells MC regardless of a temperature, if programming is performed at a high temperature HT (FIG. 5A), programming with respect to all OTP cells MC is successful at a programming voltage VPP of 4.9 V or higher. However, if programming is performed at a low temperature CT (FIG. 5B), programming with respect to all OTP cells MC is successful only with a programming voltage VPP of 5.4 V or higher. That is, the lower the temperature, the lower may be the yield due to the deterioration of characteristics of OTP programming mechanisms such as such as gate oxide layer breakdown or junction breakdown. Accordingly, as illustrated in FIG. 5C, a programming margin may be relatively poor at a low temperature.

Figure 6:
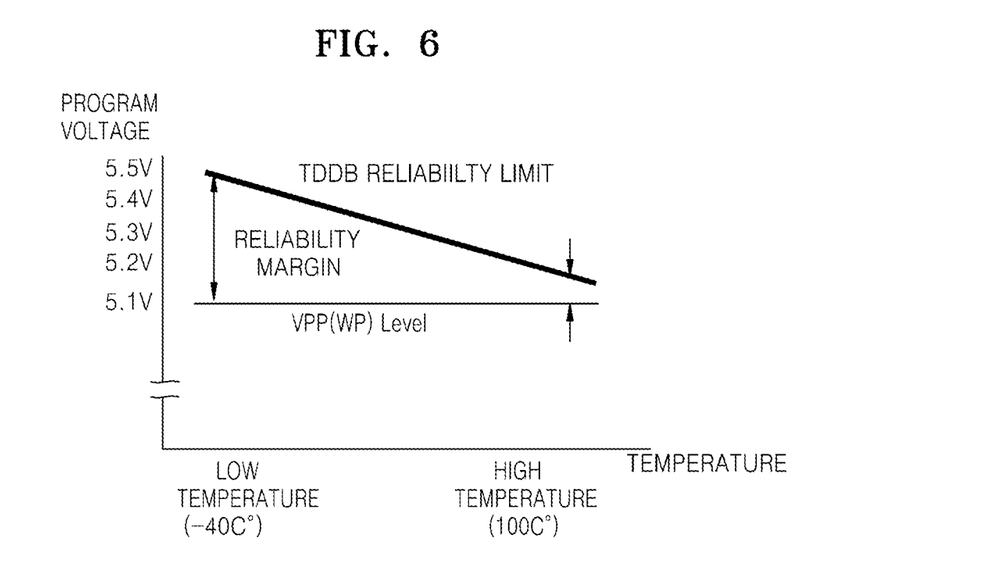

When programming or reading is performed, reliability issues such as time dependent dielectronic breakdown (TDDB) related to the lifetime of the gate oxide layer adjacent or hot-carrier injection (HCI) related to the lifetime of an NMOS transistor may be more of a problem at a high temperature HT than a low temperature CT. For example, as illustrated in FIG. 6 where a reliability margin due to a programming voltage that is applied regardless of a temperature is illustrated, the higher the temperature, the smaller that the reliability margin may be. Also, compared to a low temperature CT, a programming margin due to adjacent OTP cells MC may be caused at a high temperature HT.

FIGS. 5A, 5B, 5C, and 6 are graphs showing characteristics of an OTP memory according to at least one example embodiment of the inventive concepts. In FIGS. 5A, 5B, 5C, and 6, a low temperature CT of −40° C. is set, and a high temperature HT of 100° C. is set. The phenomenon of FIGS. 5A, 5B, 5C, and 6 may be more of a problem if a minute process is required. However, the OTP memory 100 according to at least one example embodiment of the inventive concepts may compensate for the yield and the reliability of the OTP memory 100 with respect to temperature so as to improve the yield of the OTP memory 100 and provide a reliability margin regardless of the temperature.

Figure 7:
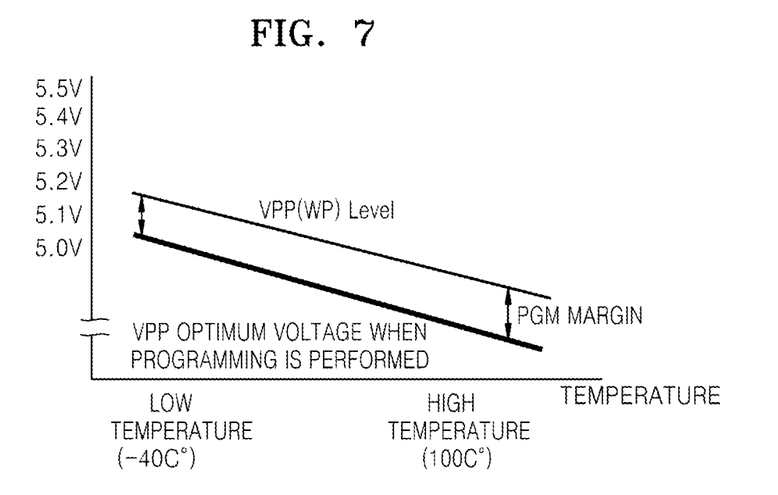
FIGS. 7 and 8 are graphs showing characteristics of an OTP memory according to at least one example embodiment of the inventive concepts.
Figure 8:
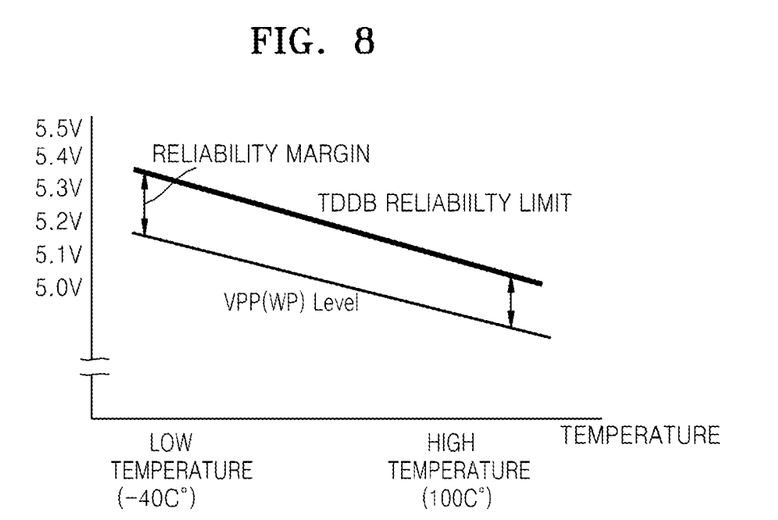

FIGS. 7 and 8 are graphs showing characteristics of an OTP memory 100 according to at least one example embodiment of the inventive concepts. FIG. 7 is a graph showing programming margin characteristics of the OTP memory 100, and FIG. 8 is a graph showing reliability margin characteristics of the OTP memory 100. First, referring to FIGS. 1A and 7, a programming voltage VPP, which is at a higher voltage level at a low temperature than at a high temperature, is set. For example, about 5.5 V may be set as the programming voltage VPP at a low temperature, and about 5.1 V may be set as the programming voltage VPP at a high temperature. The programming voltage VPP as described above may have a uniform margin regardless of a temperature of the OTP memory 100, unlike in FIG. 5C. Next, referring to FIGS. 1A and 8, the programming voltage VPP according to at least one example embodiment of the inventive concepts, which is at a higher voltage level at a low temperature than at a high temperature, may be set, and thus, unlike FIG. 6, the programming voltage VPP may have a uniform reliability margin regardless of the temperature of the OTP memory 100.

While description has been focused on the programming voltage VPP above, the reading voltage IVC may also be set in the same manner. That is, like the programming voltage VPP that is inversely proportional to a temperature, the reading voltage IVC is also set to be inversely proportional to a temperature. For example, the reading voltage IVC may be set to be half of the programming voltage VPP. Thus, the programming voltage VPP and the reading voltage IVC may be inversely proportional to a temperature because the programming voltage VPP and the reading voltage IVC are generated based on the reference Voltage that is also inversely proportional to a temperature. For example, the programming voltage VPP may be generated by charge pumping of the reference voltage VREF, and the reading voltage IVC may be generated by regulating the reference voltage VREF, as described below.

Figure 9:
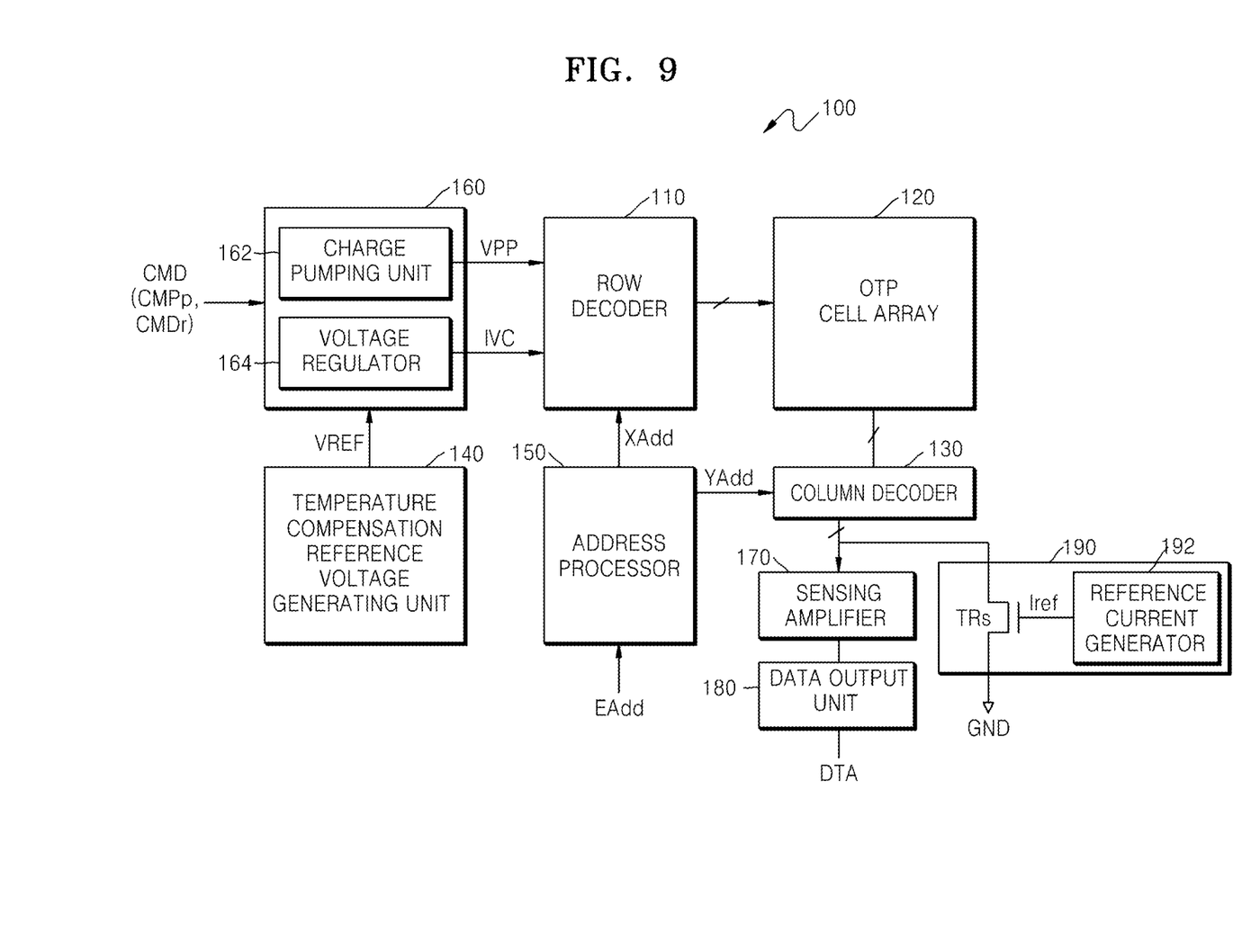
FIG. 9 illustrates the OTP memory of FIG. 1A according to at least one example embodiment of the inventive concepts.

FIG. 9 illustrates the OTP memory 100 of FIG. 1A according to at least one example embodiment of the inventive concepts. Referring to FIG. 9, the OTP memory 100 includes, as described above with reference to FIG. 1A, the OTP cell array 120, the temperature compensation reference voltage generating unit 140, and the temperature compensation operating voltage generating unit 160. The OTP cell array 120 is as described above and thus detailed description thereof will be omitted here. Also as described above, the temperature compensation reference voltage generating unit 140 senses a temperature of the OTP memory 100, for example, an external temperature, to generate the reference voltage VREF as illustrated in FIG. 1B, which is inversely proportional to the sensed temperature.

Figure 10:
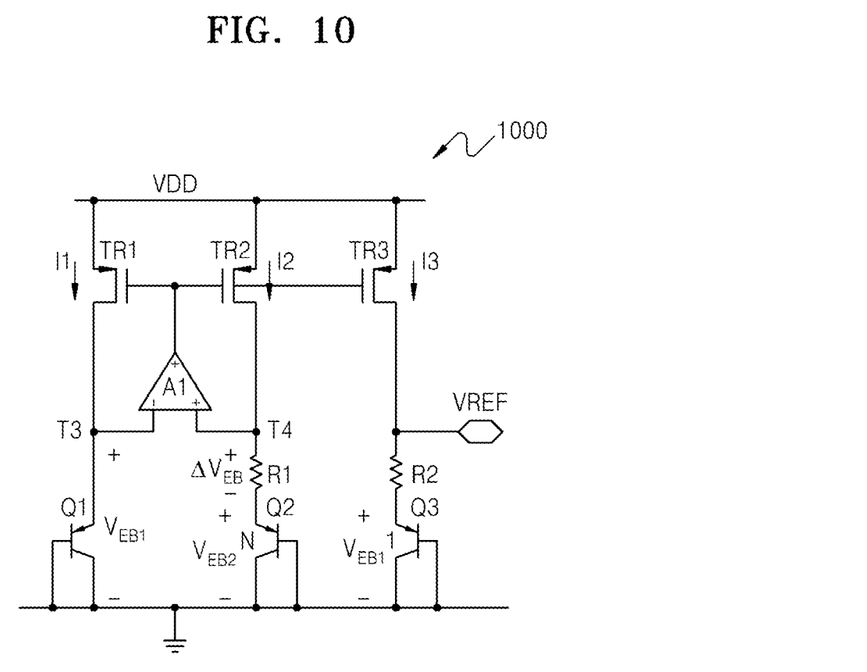
FIG. 10 illustrates a temperature compensation reference voltage generating unit according to at least one example embodiment of the inventive concepts.

FIG. 10 illustrates the temperature compensation reference voltage generating unit 140 according to at least one example embodiment of the inventive concepts. Referring to FIGS. 9 and 10, the temperature compensation reference voltage generating unit 140 may include a bandgap voltage reference circuit 1000, which is capable of sensing a temperature. For example, when generating a reference voltage VREF, the bandgap voltage reference circuit 1000 adjusts an amount of a resistor connected to a node through which a reference voltage VREF is output, to thereby generate the reference voltage VREF that is inversely proportional to the sensed temperature. In detail, by reducing a resistance of a resistor R2 connected to the node through which the reference voltage VREF is output so that it is smaller than that of another resistor (resistor R1), a degree of temperature compensation may be adjusted. In detail, as voltages of nodes T3 and T4 are equal due to an amplifier A1 in the bandgap voltage reference circuit 1000 of FIG. 10, Equation (1) below is set.

$$V_{EB1} = \Delta V_{EB} + V_{EB2} \quad (1)$$

Also, due to a current mirror formed of transistors TR1, TR2, and TR3, Equation (2) as follows is set.

$$I1 = I2 = I3 \quad (2)$$

A voltage $V_{EB1}$ of Equation 1 is as expressed in Equation 3 due to operating characteristics of a bipolar junction transistor (BJT) Q1.

$$V_{ES1} = Vt \ln(I1/Is) \quad (3)$$

In Equation (3), Vt denotes a base-emitter voltage of the BJT Q1, and Is denotes a collector current. The change value $\Delta V_{EB}$ may be expressed as in Equation (4) based on Equations (1) and (3). Here, it is assumed that I1=I2 in Equation (2) and a ratio between the BJT Q1 and a BJT Q2 is 1:N.

$$\Delta V_{EB} = Vt \ln N \quad (4)$$

The change value $\Delta V_{EB}$ is a multiplication of a resistance R1 by a current I2, and thus may be expressed as in Equation (5) below.

$$I3 = I2 = Vt \ln N / R1 \quad (5)$$

The reference voltage VREF is a sum of a base-emitter voltage $V_{EB3}$ of the BJT Q3 and a voltage applied to the resistor R2, and thus may be expressed as in Equation (6) below.

$$VREF = V_{EB3} + Vt \ln(R2/R1) \quad (6)$$

The base-emitter voltage $V_{EB3}$ is a complementary to absolute temperature (CTAT) that decreases with an increase in temperature, and a voltage applied to the resistor R2 is proportional to absolute temperature (PTAT) voltage that increases with an increase in a temperature. Accordingly, by setting a resistance of the resistor R2 to be smaller than that of a resistor R1, a reference voltage VREF may have characteristics of decreasing according to an increase in temperature as illustrated in FIG. 1B. Due to a ratio R2/R1 between the resistor R2 and the resistor R1, a slope of the reference voltage VREF according to temperature may be set to a desired value.

Due to the operation described above, in the bandgap voltage reference circuit 1000 of FIG. 10, the reference voltage VREF, which is at a higher voltage level at a low temperature than at a high temperature, may be generated. However, example embodiments of the inventive concepts are not limited thereto. The temperature compensation reference voltage generating unit 140 may also have a different structure from the bandgap voltage reference circuit 1000 of FIG. 10.

Referring to FIG. 9, the temperature compensation operating voltage generating unit 160 of the OTP memory 1000 may receive the reference voltage VREF that is inversely proportional to temperature to thereby generate an operating voltage VOP that is proportional to the reference voltage VREF. The temperature compensation operating voltage generating unit 160 may include a charge pumping unit 162 that generates a programming voltage VPP, which is one of the operating voltages VOP, and a voltage regulator 164 that generates a reading voltage IVC which is one of the operating voltages VOP. The charge pumping unit 162 and the voltage regulator 164 increase a voltage level of the reference voltage VREF to generate a programming voltage VPP and a reading voltage IVC.

As described above, the programming voltage VPP and the reading voltage IVC according to at least one example embodiment of the inventive concepts may be about 5 V and about 2.5 V, respectively. The temperature compensation operating voltage generating unit 160 includes the charge pumping unit 162 and the voltage regulator 164 in order to respectively level up the reference voltage VREF to the voltage levels described above, and is not limited thereto. If voltage levels of the reference voltage VREF, the programming voltage VPP, and the reading voltage IVC are different, the temperature compensation operating voltage generating unit 160 may level up the reference voltage VREF to the programming voltage VPP and the reading voltage IVD by using a different structure.

As illustrated in FIG. 9, the OTP memory 100 according to at least one example embodiment of the inventive concepts may further include, in addition to the OTP cell array 120, the temperature compensation reference voltage generating unit 140, and the temperature compensation operating voltage generating unit 160 of FIG. 1, a row decoder 110, a column decoder 130, an address processing unit 150, a sensing amplifier 170, a data output unit 180, and a current control unit 190, which are needed to perform the above-described operation.

According to at least one example embodiment, the row decoder 110 activates a word line WL corresponding to a row address XAdd, and the column decoder 130 activates a bit line BL corresponding to a column address YAdd. The row address XAdd and the column address YAdd may be transmitted by the address processing unit 150. The address processing unit 150 may extract an external address EAdd applied to the OTP memory 100, as the row address XAdd and the column address YAdd. Accordingly, an address latch may be implemented as the address processing unit 150.

According to at least one example embodiment, the sensing amplifier 170 senses and amplifies, in response to a reading command CMDr applied to the OTP memory 100, a current I (see FIG. 4) supplied through the bit line BL that is activated by using the column decoder 130. The data output unit 180 may output the amplified current from the OTP cell MC, as the current itself or as a voltage corresponding to the current. The current or the voltage may be processed as data DTA. The current control unit 190 may sink a current from a bit line BL to ground, in response to a programming command CMDp. The current control unit 190 may include a sink transistor TRs connected to ground and a reference current generator 192 that supplies a reference current Iref to a gate of the sink transistor TRs.

Figure 11:
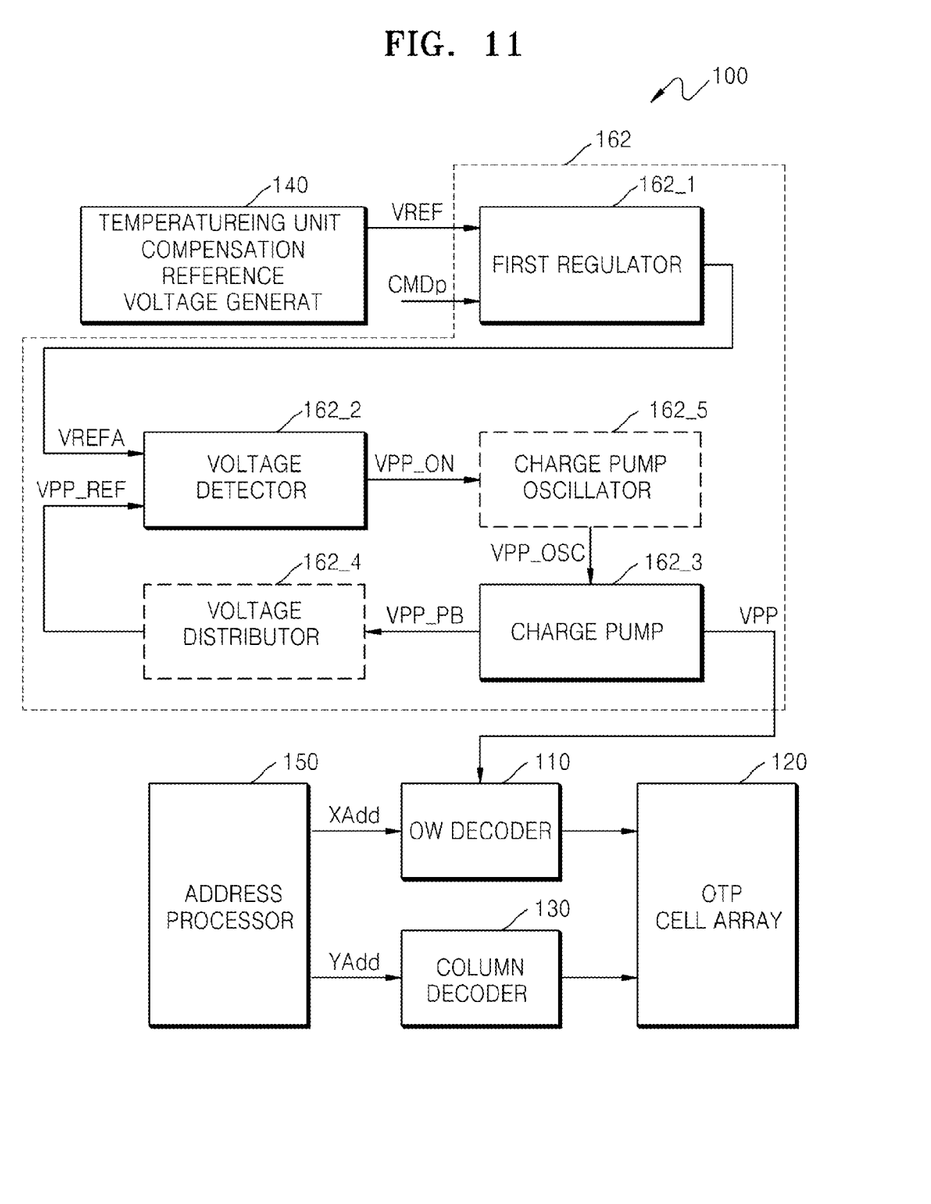
FIG. 11 illustrates an operation of applying a programming voltage of FIG. 9 to an OTP cell array according to at least one example embodiment of the inventive concepts.

FIG. 11 illustrates an operation of applying a programming voltage of FIG. 9 to an OTP cell array according to at least one example embodiment of the inventive concepts. Referring to FIG. 11, the charge pumping unit 162 may include a first regulator 162_1, a voltage detector 162_2, and a charge pump 162_3. The first regulator 162_1 may regulate the reference voltage VREF received from the temperature compensation reference voltage generating unit 140, in response to a programming command CMDp, to output a first voltage VREFA having voltage level that is leveled up relative to the reference voltage VREF. The voltage detector 162_2 may detect a difference between the first voltage VREFA and a second voltage VPP_REF corresponding to a feedback voltage VPp_PB of the programming voltage VPP to output a detection voltage VPP_ON.

FIG. 11 illustrates an example where the voltage detector 162_2 outputs a difference between the first voltage VREFA and a second voltage VPP_REF, which is a voltage obtained by a difference between the first voltage VREFA and a distributing a feedback voltage VPP_PB, instead of a difference between the first voltage VREFA and the voltage corresponding to the feedback voltage VPP_PB of the programming voltage VPP, as a detection voltage VPP_ON. To this end, the charge pumping unit 162 may further include a voltage distributor 162_4 that outputs a second voltage VPP_REF by distributing a feedback voltage VPP_PB at a predetermined ratio. Though the second voltage VPP_REF corresponding to the feedback voltage VPP_PB may be the feedback voltage VPP_PB itself. In this case, the voltage distributor 162_4 may not be included.

The charge pump 162_3 outputs the voltage VPP_REF corresponding to the detection voltage VPP_ON as a programming voltage VPP. In FIG. 11, a charge pumping operation of the charge pump 162_3 may vary according to a voltage level of the detection voltage VPP_ON. The charge pump 162_3 may be controlled according to a control clock VPP_COS that is applied by using a charge pump oscillator 162_5.

The programming voltage generated by the charge pumping unit 162 may be applied to a word line WL that is activated by using the row decoder 110. As described above, the row decoder 110 activates the word line WL corresponding to a row address XAdd transmitted from the address processor 150. The column decoder 130 activates a bit line BL corresponding to a column address YAdd transmitted from the address processor 150. For example, the column decoder 130 applies a voltage of 0 V to the bit line BL corresponding to the column address YAdd, and may apply 2V to the other bit lines BL.

Figure 12:
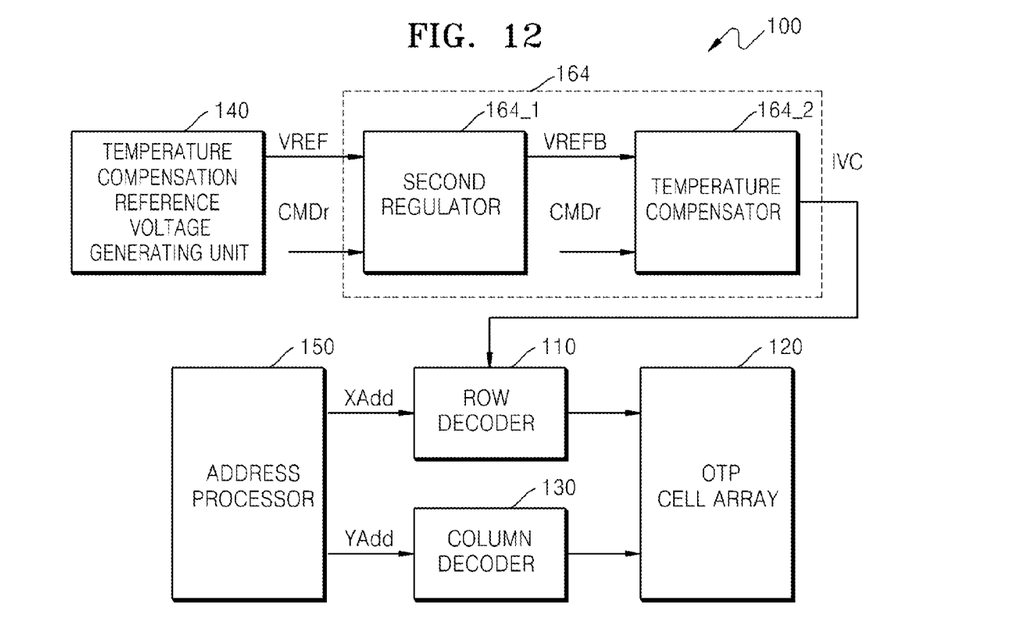
FIG. 12 illustrates an operation of applying a reading voltage of FIG. 9 to an OTP cell array according to at least one example embodiment of the inventive concepts.

FIG. 12 illustrates an operation of applying a reading voltage of FIG. 9 to an OTP cell array according to at least one example embodiment of the inventive concepts. Referring to FIG. 9, the voltage regulator 164 may include a second regulator 164_1 and a temperature compensator 164_2. The second regulator 164_1 regulates the reference voltage VREF to a third voltage VREFB that has a higher voltage level than the reference voltage VREF. The temperature compensator 164_2 may sense a temperature of the OTP memory 100 to generate the third voltage VREFB as a reading voltage IVC. The temperature compensator 164_2 may provide stable power with an external power source, and generate a reading voltage IVC such that a voltage level decreases from a low temperature to a high temperature. The temperature compensator 164_2 may have a similar structure as that of the band gap voltage reference circuit 1000 of FIG. 10 described above.

The OTP memory 100 may have a higher programming success rate and an improved reliability margin by setting a programming voltage VPP and a reading voltage IVC to be lower when a temperature of the OTP memory 100 is high temperature than when a temperature of the OTP memory 100 is low. As a result of setting the programming voltage VPP and reading voltage IVC to vary with a temperature of the OTP memory 100 in a manner described above with reference to example embodiments of the inventive concepts, described above, product defects may be prevented to thereby increase a yield of the OTP memory 100, a high programming success rate may be realized, and an improved reliability margin may be realized. Accordingly, a reliability margin of adjacent OTP cells MC that are not selected during programming in the OTP memory 100 may be improved. Also, as a relatively low voltage level of the programming voltage VPP may be set at a high temperature, a surface area of the charge pumping unit 162 may be reduced to thereby reduce a chip size.

Figure 13:
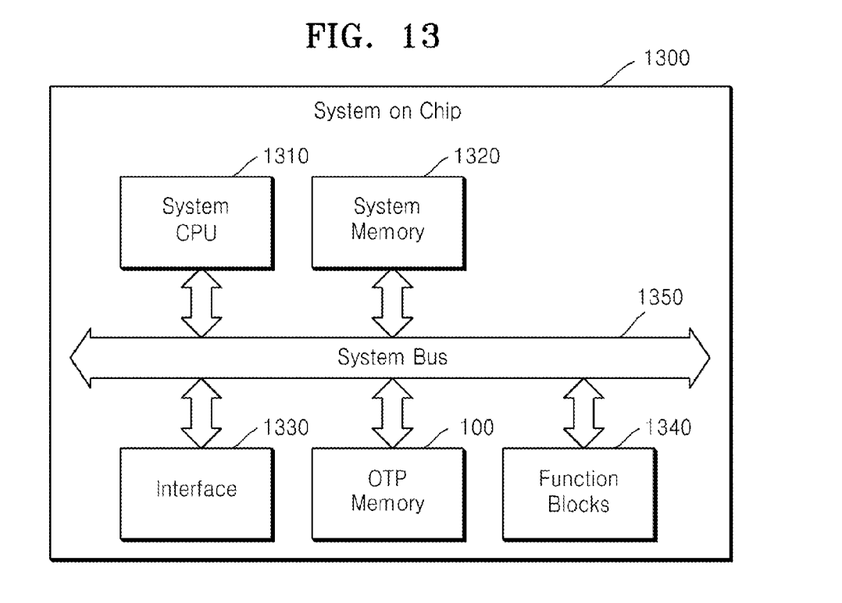
FIG. 13 illustrates a system-on chip (SoC) according to at least one example embodiment of the inventive concepts.

FIG. 13 illustrates a system-on chip (SoC) 1300 according to at least one example embodiment of the inventive concepts. Referring to FIG. 13, the SoC 1300 may include a central processing unit 1310, a system memory 1320, an interface 1330, an OTP memory 100, function blocks 1340, and a bus 1350 that connect these components. The central processing unit 1310 controls an operation of the SoC 1300. The central processing unit 1310 may include a core and an L2 cache. For example, the central processing unit 1310 may include a multi-core. Each core of the multi-core may be identical or different. Also, each core of the multi-core may be activated simultaneously or at different times. The system memory 1320 may store results that are processed in the function blocks 1340 according to a control of the central processing unit 1310. For example, as contents stored in the L2 cache of the central processing unit 1310 are flushed, the contents stored in the L2 cache may be stored in the system memory 1320. The interface 1330 may perform interfacing with external devices. For example, the interface 1330 may perform interfacing with a camera, an LCD, or a speaker.

The OTP memory 100 may store set up information with respect to the SoC 1300. As described above, the OTP memory 100 senses a temperature of the OTP memory 100 or the SoC 1300 to set a programming voltage VPP and a reading voltage IVC to be lower at a high temperature than a low temperature to thereby increase a programming success rate and improve a reliability margin. Accordingly, the reliability of the SoC 1300 may be improved by including the OTP memory 100. The function blocks 1340 may perform various functions required in the SoC 1300. For example, the function blocks 1340 may perform video codec or process 3D graphics.

Figure 14:
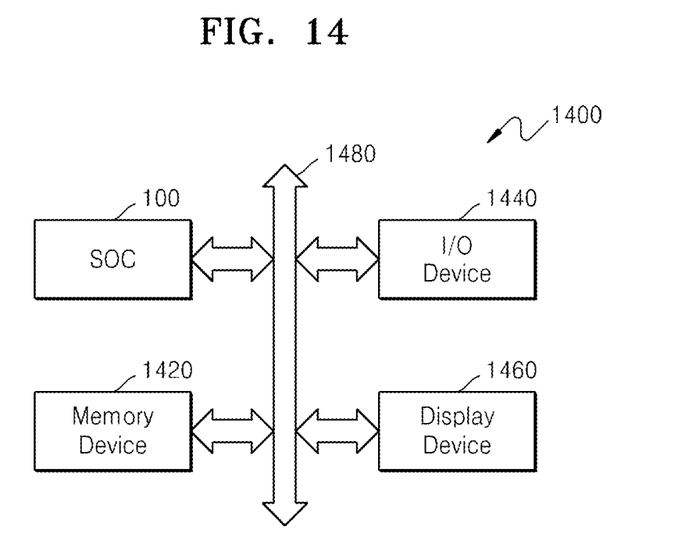
FIG. 14 illustrates a computing device according to at least one example embodiment of the inventive concepts.

FIG. 14 illustrates a computing system 1400 according to at least one example embodiment of the inventive concepts. According to at least one example embodiment of the inventive concepts, the SoC 1300 may be mounted in the computing system 1400 such as a mobile device, a desktop computer, or a server. Also, the computing system 1400 may further include a memory device 1420, an input/output device 1440, and a display device 1460 which may be electrically connected to a bus 1480. The computing system 1400 may operate based on set up information stored in the OTP memory 100. Thus, the reliability of the computing system 1400 may be improved.

Example embodiments having thus been described, it will be obvious that the same may be varied in many ways. Such variations are not to be regarded as a departure from the intended spirit and scope of example embodiments of the inventive concepts, and all such modifications as would be obvious to one skilled in the art are intended to be included within the scope of the following claims.

What is claimed is:

1. An one-time programmable (OTP) memory comprising:
   an OTP cell array including a plurality of OTP cells that each include a programming transistor configured to change irreversibly when programmed;
   a temperature compensation reference voltage generating unit configured to sense a temperature of the OTP cell memory and generate a reference voltage such that as the sensed temperature changes, the reference voltage generated by the temperature compensation reference voltage generating unit changes in a manner that is inversely proportional to the change in the sensed temperature; and
   a temperature compensation operating voltage generating unit configured to receive the reference voltage to generate one or more operating voltages that are proportional to the reference voltage and are applied to the OTP cell array,
   the temperature compensation operating voltage generating unit including a voltage regulator configured to perform voltage regulation on the reference voltage to generate, as a first operating voltage from among the one or more operating voltages, a reading voltage corresponding to a reading command applied to the OTP memory.

2. The OTP memory of claim 1,
   wherein the one or more operating voltages includes the reading voltage and a programming voltage, and
   wherein the temperature compensation operating voltage generating unit further comprises:
   a charge pumping unit configured to perform charge pumping on the reference voltage to the programming voltage corresponding to a programming command applied to the OTP memory.

3. The OTP memory of claim 2, wherein the OTP memory is configured such that the programming voltage is applied to a gate of the programming transistor and is inversely proportional to a temperature of the OTP memory.

4. The OTP memory of claim 2, wherein each OTP cell further includes a reading transistor that has a gate through which the reading voltage is applied,
   wherein the reading voltage is inversely proportional to the temperature of the OTP memory.

5. The OTP memory of claim 2, wherein the charge pumping unit comprises:
   a level up regulator configured to regulate the reference voltage to a first voltage having a higher voltage level than the reference voltage;
   a voltage detector configured to detect a difference between the first voltage and a second voltage having a voltage level corresponding to a feedback voltage of the programming voltage, to output a detection voltage; and
   a charge pump configured to output a voltage corresponding to the detection voltage as the programming voltage.

6. The OTP memory of claim 5, wherein the charge pumping unit further comprises:
   a voltage distributor configured to distribute the feedback voltage to output the voltage-distributed feedback voltage as the second voltage.

7. The OTP memory of claim 2, wherein the voltage regulator comprises:
   a level up regulator configured to regulate the reference voltage to a third voltage having a higher voltage level than the reference voltage; and
   a temperature compensator configured to sense a temperature of the OTP memory to generate the third voltage as the reading voltage that is inversely proportional to the sensed temperature.

8. The OTP memory of claim 1, wherein the OTP memory is configured such that, in response to a programming command applied to the OTP memory, all OTP cells of the OTP cell array are simultaneously programmed.

9. The OTP memory of claim 1, wherein the OTP memory is configured such that, in response to a programming command applied to the OTP memory, some of the plurality of OTP cells of the OTP cell array are simultaneously programmed.

10. The OTP memory of claim 1, wherein the programming transistor of each of the plurality of OTP cells has a gate that is connected to a corresponding programming word line from among word lines of the OTP cell array; and
    wherein each of the plurality of OTP cells further comprises:
    a reading transistor having a first terminal that is connected to a first terminal of the programming transistor, a second terminal that is connected to a corresponding bit line from among bit lines of the OTP cell array, and a gate that is connected to a corresponding reading word line from among the word lines of the OTP cell array, wherein the gate is configured to receive the reading voltage.

11. The OTP memory of claim 1, wherein the programming transistors of each of plurality of OTP cells are metal oxide semiconductor field effect transistors (MOSFET)s.

12. The OTP memory of claim 1, wherein the temperature compensation operating voltage generating unit comprises: a bandgap voltage reference circuit.

13. The OTP, memory of claim 1; further comprising:
a row decoder configured to activate at least one word line corresponding to a row address from among word lines of the OTP cell array;
a column decoder configured to activate at least one bit line corresponding to a column address from among bit lines of the OTP cell array; and
an address processor configured to extract the row address and the column address from an external address input to the OTP memory from a source outside the OTP memory to respectively transmit the row address and the column address to the row decoder and the column decoder.

14. The OTP memory of claim 13, further comprising:
a sensing amplifier configured to sense and amplify an electrical signal of the activated at least one bit line in response to a reading command applied to the OTP memory;
a data input/output unit configured to output the electrical signal that is sensed and amplified by the sensing amplifier, as data corresponding to the reading command; and
a current controller configured to sink a current flowing through the activated at least one bit line to ground, in response to a programming command applied to the OTP memory.

15. A system-on chip (SoC) comprising:
the one-time programmable (OTP) memory of claim 1.

16. A memory apparatus comprising:
a memory cell array including a plurality of one time programmable (OTP) memory cells, the plurality of OTP memory cells each including a respective one of a plurality of programming transistors;
an operating voltage generation unit configured to generate one or more operating voltages based on a reference voltage and configured to apply the one or more operating voltages to the memory cell array; and
a reference voltage generation unit configured generate the reference voltage based on a temperature of the memory apparatus such that as the sensed temperature changes, the reference voltage generated by the temperature compensation reference voltage generating unit changes in a manner that is inversely proportional the change in the sensed temperature,
the memory apparatus being configured such that programming a selected cell from among the plurality OTP memory cells includes changing, in an irreversible manner, a program state of the respective programming transistor included in the selected cell,
a first operating voltage, from among the one or more operating voltages, being a reading voltage for reading data stored in the memory cell array.

17. The memory apparatus of claim 16,
wherein the one or more operating voltages includes the reading voltage and a programming voltage, and
wherein the operating voltage generation unit configured to generate the operating voltage such that the generated operating voltage is one of a reading voltage for reading data stored in the memory cell array and a programming voltage for programming data into the memory cell array.

18. The memory apparatus of claim 17, wherein the operating voltage generating unit comprises:
a charge pumping unit configured to perform a charge pumping operation on the reference voltage to generate the programming voltage.

19. The memory apparatus of claim 17, wherein the operating voltage generating unit comprises:
a voltage regulator configured to perform a voltage regulation operation on the reference voltage to generate the reading voltage.

20. The OTP memory of claim 16, wherein the programming transistor of each of the plurality of OTP cells has a gate that is connected to a corresponding programming word line from among word lines of the memory cell array; and
wherein each of the plurality of OTP cells further comprises:
a reading transistor having a first terminal that is connected to a first terminal of the programming transistor, a second terminal that is connected to a corresponding bit line from among bit lines of the memory cell array, and a gate that is connected to a corresponding reading word line from among the word lines of the memory cell array, wherein the gate is configured to receive the reading voltage.

* * * * *